US009210524B2

(12) United States Patent
Sherwood et al.

(10) Patent No.: US 9,210,524 B2
(45) Date of Patent: Dec. 8, 2015

(54) AIRCRAFT AUDIO PANEL ROUTING

(75) Inventors: Charles Gregory Sherwood, Olathe, KS (US); Luke E. Bogner, Gardner, KS (US); Joseph E. Gepner, Overland Park, KS (US); Tyler O. Vrooman, Olathe, KS (US); Timothy W. James, Olathe, KS (US)

(73) Assignee: Garmin International, Inc., Olathe, KS (US)

( * ) Notice: Subject to any disclaimer, the term of this patent is extended or adjusted under 35 U.S.C. 154(b) by 1171 days.

(21) Appl. No.: 12/960,167

(22) Filed: Dec. 3, 2010

(65) Prior Publication Data

US 2012/0140934 A1 Jun. 7, 2012

(51) Int. Cl.
*H03B 1/00* (2006.01)
*H04R 29/00* (2006.01)
*H04R 5/04* (2006.01)

(52) U.S. Cl.
CPC .................. *H04R 29/00* (2013.01); *H04R 5/04* (2013.01); *H04R 2420/01* (2013.01)

(58) Field of Classification Search
CPC ......... H04H 60/04; H04H 60/05; H04R 5/04; H04R 2420/01; H04R 2420/03
USPC .................................... 381/86, 109, 119, 123
See application file for complete search history.

(56) References Cited

U.S. PATENT DOCUMENTS 3,404,657 A 10/1968 Zmuda
5,757,941 A 5/1998 McMillen ..................... 381/119
6,954,639 B1 10/2005 James ........................... 455/431
7,002,994 B1 2/2006 Haendel ........................ 370/480
7,151,444 B1 12/2006 Doyle ........................ 340/539.1
2005/0129056 A1 6/2005 Suzuki .......................... 370/462
2009/0278707 A1 11/2009 Biggins et al. ........... 340/870.16
2011/0009990 A1 * 1/2011 Terada et al. .................. 700/94

OTHER PUBLICATIONS

PS Engineering, PMA9000EX, Pilot's Guide and Operation Manual, Revision 5, Oct. 2010, <www.ps-engineering.com/docs/PMA9000EX_PG.pdf>.*
Aviation Panel Faceplates, Published before Dec. 3, 2010.

(Continued)

*Primary Examiner* — Duc Nguyen
*Assistant Examiner* — Kile Blair
(74) *Attorney, Agent, or Firm* — Samuel M. Korte; Maxwell M. Ali

(57) ABSTRACT

An aircraft audio panel includes a plurality of audio inputs each configured for receiving audio communications from an audio source; a plurality of audio outputs each configured for outputting the audio communications to audio equipment in the aircraft; selecting circuitry for selecting the audio communications between the audio inputs and the audio outputs; a single selector for permitting selection of one of the audio inputs or audio outputs for adjustment; and a single audio controller for permitting adjustment of an audio characteristic of the selected audio input or audio output. The audio panel may also include an audio characteristic indicator for indicating an audio characteristic of the selected audio input or audio output. The selecting circuitry may also implement a routing mode in which a user may first initiate the routing mode, then select one of the audio inputs for routing, and then select any one of the audio outputs for receiving audio communications from the selected audio input.

36 Claims, 3 Drawing Sheets

(56) References Cited

OTHER PUBLICATIONS

Garmin's GMA 347 Audio Panel Pilot's Guide, Revision A, dated Jun. 2005.

Honeywell KMA 29 Audio Panel Pilot's Guide, Revision 1, dated Sep. 2007.

PS Engineering, Incorporated, PMA8000B System Installation and Operation Manual, Revision 13, Dec. 2009.

U.S. Appl. No. 12/960,162, filed Dec. 3, 2010.

* cited by examiner

AIRCRAFT AUDIO PANEL ROUTING

BACKGROUND

Aircraft frequently transmit and receive communications and navigation signals over a plurality of communication and navigation channels. To coordinate the selection and use of different communication and navigation channels, most conventional aircraft include one or more audio panels that include circuitry and controls for selecting between the various available communications and navigation channels. Due to the high number of communication and navigation signals received by modern aircraft, the aircraft may contain many knobs to adjust and control characteristics of the signals. The preset routing configurations between crew members and passengers are often associated with a single intercom isolation mode. To select a preset routing configuration, the pilot must typically retrieve the preset intercom isolation mode from reference materials or memory.

SUMMARY

Embodiments of the present technology provide an aircraft audio panel with improved audio characteristic adjustment capabilities and improved audio routing capabilities.

One embodiment of the aircraft audio panel comprises a plurality of audio inputs each configured for receiving audio communications from an audio source; a plurality of audio outputs each configured for outputting the audio communications to audio equipment in the aircraft; and selecting circuitry for selecting the audio communications between the audio inputs and the audio outputs. To provide for the adjustment of audio characteristics such as volume or squelch, the audio panel may include audio characteristic controls comprising an audio input selector for permitting selection of one of the audio inputs or audio outputs for adjustment and an audio controller for permitting adjustment of an audio characteristic of the selected audio input or audio output. An embodiment of the audio controller may comprise a rotatable audio controller knob, and an embodiment of the audio input selector may comprise a rotatable audio input selector knob. In some embodiments, the audio input selector knob is concentrically disposed around the audio controller knob. This configuration provides an audio input selector to select any one of the audio inputs or outputs for adjustment and an audio controller to adjust an audio characteristic of the selected audio input or output formed as an integrated control, thus saving valuable panel space with an intuitive and ergonomic control scheme.

Another embodiment of the aircraft audio panel comprises a plurality of audio inputs each configured for receiving audio communications from an audio source; a plurality of audio outputs each configured for outputting the audio communications to audio equipment in the aircraft; an audio input selector for permitting selection of one of the audio inputs or audio outputs; and an electronic display indicator for indicating an audio characteristic of the selected audio input or audio output. This configuration provides a visual indication of the level or magnitude of an audio characteristic for any audio input or output with a single electronic display indicator and thus provides useful visual feedback of volume or squelch while saving valuable panel space.

Another embodiment of the aircraft audio panel comprises a plurality of audio inputs each configured for receiving audio communications from an audio source; a plurality of audio outputs each configured for outputting the audio communications to audio equipment in the aircraft; and selecting circuitry for selecting the audio communications between the audio inputs and the audio outputs. The selecting circuitry has a routing mode in which a user may select one of the audio inputs for routing and then select one or more of the audio outputs for receiving audio communications from the selected audio input. This configuration permits a user to quickly and easily route audio communications from any selected audio inputs to any selected audio outputs with simple intuitive controls. Further, this routing mode may permit a user to route audio communications without referencing or memorizing preset intercom isolation modes.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the present technology will be apparent from the following detailed description of the embodiments and the accompanying drawing figures.

BRIEF DESCRIPTION OF THE DRAWING FIGURES

Embodiments of the present technology are described in detail below with reference to the attached drawing figures, wherein.

Figure 1:
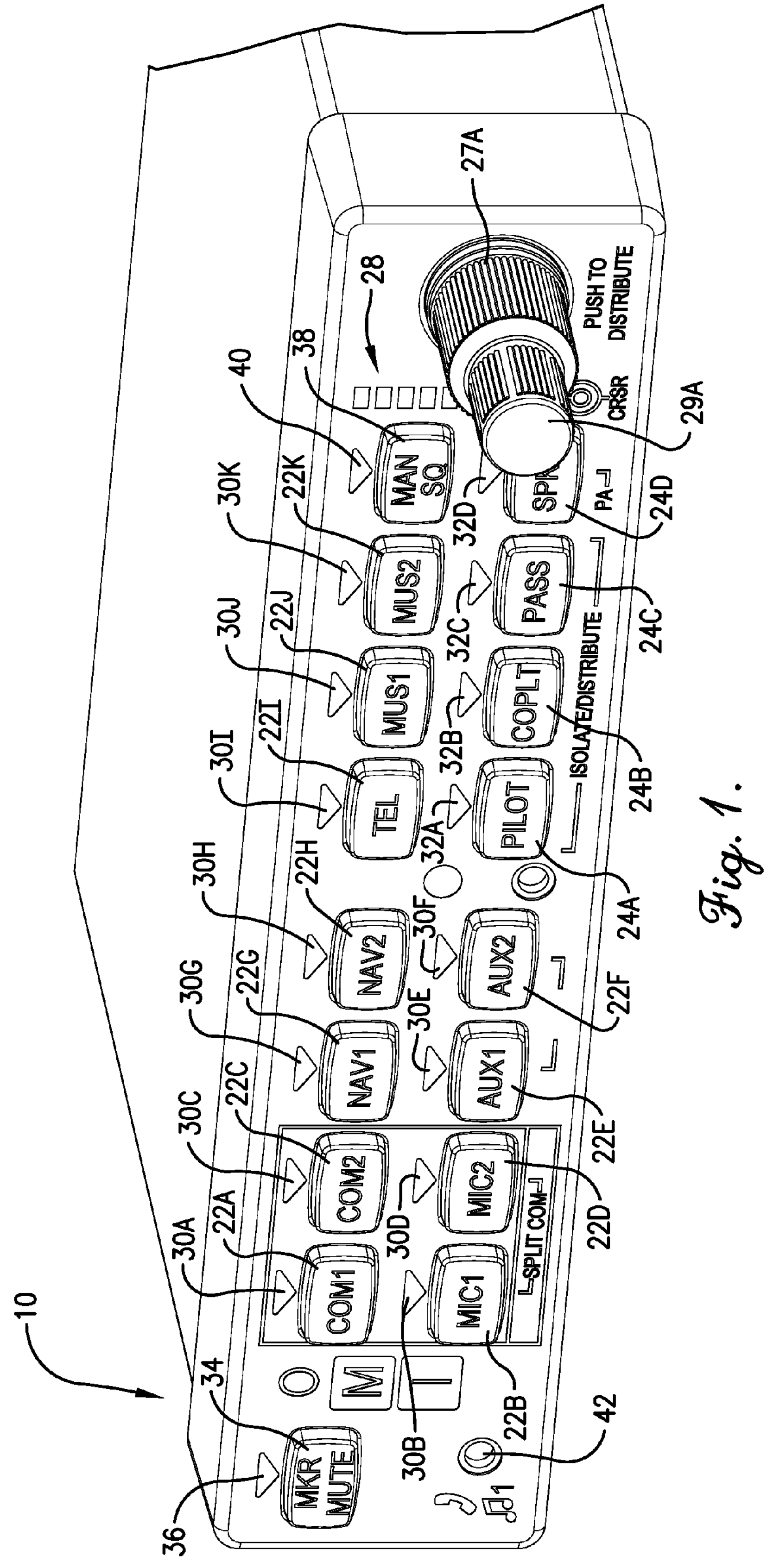
FIG. 1 is a partial perspective view of an aircraft audio panel constructed in accordance with embodiments of the present technology.

The drawing figures do not limit the present technology to the specific embodiments disclosed and described herein. The drawings are not necessarily to scale, emphasis instead being placed upon clearly illustrating the principles of the technology.

DETAILED DESCRIPTION

The following detailed description of various embodiments of the present technology references the accompanying drawings which illustrate specific embodiments in which the technology can be practiced. The embodiments are intended to describe aspects of the technology in sufficient detail to enable those skilled in the art to practice them. Other embodiments can be utilized and changes can be made without departing from the scope of the technology. The following detailed description is, therefore, not to be taken in a limiting sense. The scope of the present technology is defined only by the appended claims, along with the full scope of equivalents to which such claims are entitled.

In this description, references to "one embodiment", "an embodiment", or "embodiments" mean that the feature or features being referred to are included in at least one embodiment of the technology. Separate references to "one embodiment", "an embodiment", or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the present technology can include a variety of combinations and/or integrations of the embodiments described herein.

Embodiments of the present technology provide an audio panel with improved audio characteristic adjustment capabilities and improved audio routing capabilities. Conventional audio panels include separate volume and squelch knobs for some or all audio inputs and audio outputs. Conventional aircraft contain many audio inputs and audio outputs. Thus, these volume and squelch knobs take up valuable space on the audio panel and hence the aircraft cockpit in which the panel is mounted. This is undesirable because panel space is extremely limited in most aircraft.

Embodiments of the present technology address this problem and others by providing an aircraft audio panel with improved volume, squelch, or other audio characteristic adjustment controls and modes. An embodiment of the audio panel comprises a plurality of audio inputs each configured for receiving audio communications from an audio source; a plurality of audio outputs each configured for outputting the audio communications to audio equipment in the aircraft; and selecting circuitry for selecting the audio communications between the audio inputs and the audio outputs. To provide adjustments of audio characteristics such as volume or squelch, the audio panel also comprises an audio input selector for permitting selection of one of the audio inputs or audio outputs for adjustment; and an audio controller for permitting adjustment of an audio characteristic of the selected audio input or audio output. The audio controller may comprise a rotatable audio controller knob, and the selector may comprise an audio input selector knob that is concentrically disposed around the audio controller knob. This configuration provides an audio input selector to select any one of the audio inputs or outputs for adjustment and an audio controller to adjust an audio characteristic of the selected audio input or output formed as an integrated control, thus saving valuable panel space with an intuitive and ergonomic control scheme.

Conventional aircraft audio panels provide white lines or other indicator markings around and/or on their volume controllers to indicate the volume or squelch levels of their audio inputs and outputs. Unfortunately, these markings are often difficult to see in flight or at times of limited ambient light, such as night. Embodiments of the present technology address this problem by providing an aircraft audio panel with improved audio feedback mechanisms. An embodiment of the audio panel comprises a plurality of audio inputs each configured for receiving audio communications from an audio source; a plurality of audio outputs each configured for outputting the audio communications to audio equipment in the aircraft; an audio input selector for permitting selection of one of the audio inputs or audio outputs; and an electronic display indicator for indicating an audio characteristic of the selected audio input or audio output. In some embodiments, the electronic display indicator may provide a representation of the volume level of the audio input or audio output. For instance, the electronic display indicator may indicate the current volume and/or squelch level using a variable LED configuration, numeric indicator, or other similar electronic device. The LED confirmation may be a vertical alignment of LEDs, horizontal alignment of LEDs, or curved alignment of LEDs. The electronic display indicator may also be configured to present a real-time amplitude indication (e.g., the RMS value) of the audio input or audio output. Thus, the electronic display indicator may be configured to present any equalizer-type information. In some embodiments, the electronic display indicator may be positioned directly on the audio input selector or audio controller. This configuration provides a conspicuous and clear indication of the level or magnitude of an audio characteristic for any audio input or output with a single electronic display indicator.

Another function of an aircraft audio panel is to route audio communications from various audio inputs to one or more audio outputs. Unfortunately, many conventional audio panels do not permit full, dynamic routing between all inputs and outputs, and other conventional audio panels include cumbersome and confusing controls for doing so. For example, many conventional audio panels include intercom isolation circuitry with several preset isolation modes that permit audio communications to be delivered to certain people in the aircraft such as between any combination of the pilot, crew, and/or passengers. For instance, some preset isolation modes may route an input audio communication to the pilot and the crew but isolate the audio communication from others such as the passengers. However, these preset isolation modes often do not provide full, dynamic routing between all inputs and outputs. Thus, the conventional routing methods often require the pilot and/or flight crew to reference or memorize the effects of the preset isolation modes on the audio routing.

Embodiments of the present technology address this problem by providing an aircraft audio panel with improved audio routing capabilities. An embodiment of the audio panel comprises a plurality of audio inputs each configured for receiving audio communications from an audio source; a plurality of audio outputs each configured for outputting the audio communications to audio equipment in the aircraft; and selecting circuitry for selecting the audio communications between the audio inputs and the audio outputs. The selecting circuitry has a routing mode in which a user may select one of the audio inputs for routing and then select one or more of the audio outputs for receiving audio communications from the selected audio input. "Communications," as used herein, may refer to audio transmissions made by external radio units, e.g., other aircraft, and/or audio information generated by the audio panel 10 itself. For instance, in some configurations, the audio panel 10 may be configured to itself generate audio communications such as alerts, text-to-speech information, marker information, and/or the like, without relying on external communications. This configuration permits a user to quickly and easily route audio communications from any selected audio inputs to any selected audio outputs with simple intuitive controls and without referencing or memorizing preset intercom isolation modes.

Figure 2:
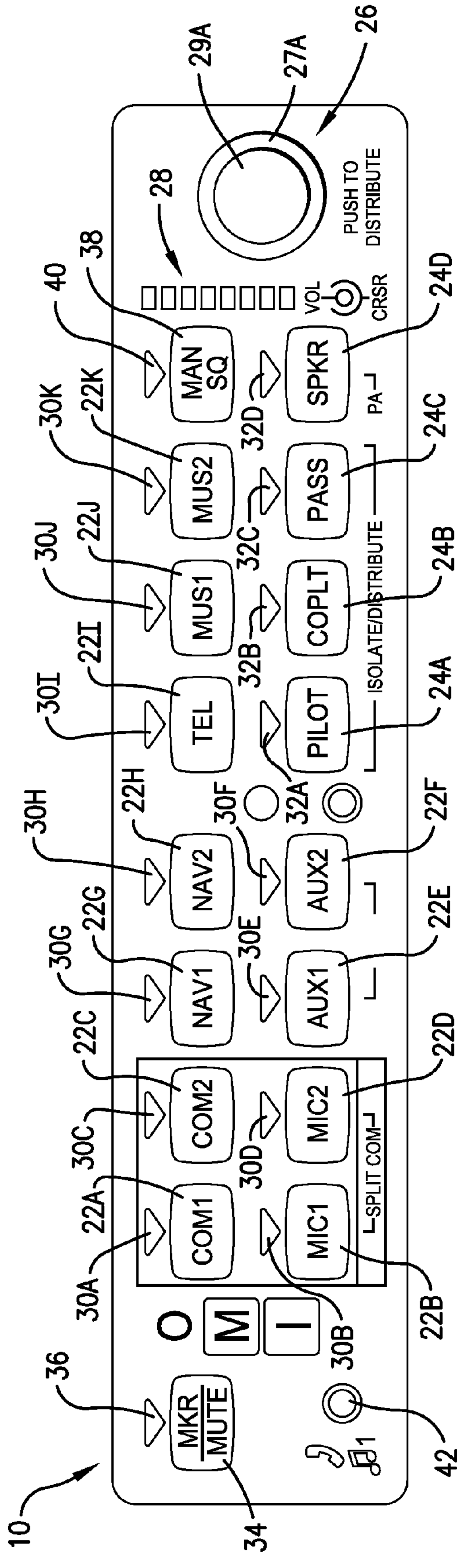
FIG. 2 is an elevational view of the front face of the aircraft audio panel of FIG. 1.

Turning now to the drawing figures, and initially FIG. 1, an audio panel 10 constructed in accordance with exemplary embodiments of the technology will now be described in more detail. The audio panel 10 is preferably designed for use in an aircraft and may be mounted either horizontally (as illustrated in FIGS. 1 and 2) or vertically and may incorporate surface mount technology and have a shallow depth to simplify installation in the tightest aircraft spaces.

An embodiment of the audio panel 10 is approximately 6.250" wide; 1.300" tall; and 6.811" deep, and yet provides control and switching of all the audio inputs and audio outputs described herein. In another embodiment, when the audio panel 10 is inserted within an installation bracket for fixing the audio panel 10 in the aircraft cockpit, the combined dimensions are approximately 6.300" wide, 1.330" tall, and 8.805" deep. In various configurations, the audio panel 10 may range between 4"-8" wide; 0.5"-3.5" tall; and 4.5"-9" deep. However, the audio panel 10 may present any size, shape, or orientation.

Figure 3:
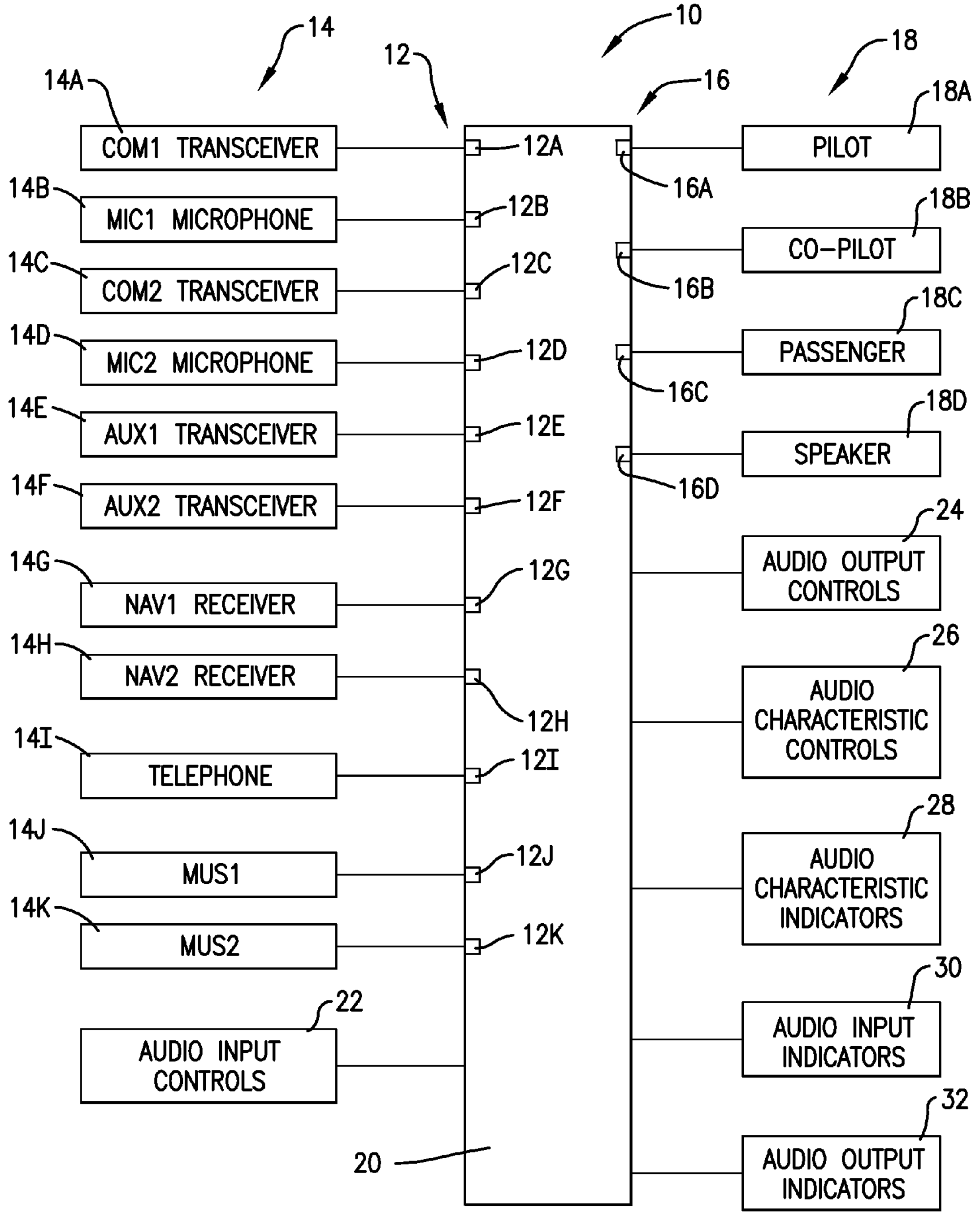
FIG. 3 is a schematic block diagram depicting certain components of the aircraft audio panel.

Referring to FIG. 3, embodiments of the audio panel 10 broadly include a plurality of ports, jacks, interfaces, wiring connectors, and/or other inputs (collectively referred to herein as "audio inputs 12") for coupling with and receiving audio communications from a plurality of audio sources 14; a plurality of ports, jacks, interfaces, wiring connectors, and/or other outputs (collectively referred to herein as "audio outputs 16") for coupling with and outputting audio communications to audio equipment 18 in the aircraft; selecting circuitry 20 for selecting the audio communications between the audio inputs 12 and the audio outputs 16; audio input controls 22 for selecting audio inputs 12 and their corresponding audio sources 14; audio output controls 24 for selecting audio outputs 16 and their corresponding audio equipment 18; audio characteristic controls 26 for selecting and/or controlling the audio characteristics of the audio inputs 12 and/or audio outputs 16; one or more audio characteristic indicators 28 for providing user feedback regarding an audio characteristic on the face of the audio panel 10; a plurality of audio input indicators 30 for providing user feedback about the status of the audio inputs 12 and their corresponding audio sources 14; and a plurality of audio output indicators 32 for providing user feedback about the status of the audio outputs 16 and their corresponding audio equipment 18.

In more detail, the audio inputs 12 may comprise an audio input 12A for receiving audio communications from a first communication (COM1) radio transceiver 14A; an audio input 12B for receiving audio communications from a first microphone (MIC1) 14B associated with the COM1 transceiver; an audio input 12C for receiving audio communications from a second communication (COM2) radio transceiver 14C; and an audio input 12D for receiving audio communications from a second microphone (MIC2) 14D associated with the COM2 transceiver. The audio inputs 12 may also comprise an audio input 12E for receiving audio communications from a first auxiliary (AUX1) radio transceiver 14E; an audio input 12F for receiving audio communications from a second auxiliary (AUX2) radio transceiver 14F; an audio input 12G for receiving information from a first navigation (NAV1) receiver 14G; an audio input 12H for receiving information from a second navigation (NAV2) receiver 14H; and an audio input 12I for receiving audio communications from a telephone (TEL) 14I. The audio inputs 12 may further comprise an audio input 12J for receiving audio communications from a first entertainment radio, MP3 player, or other similar music source (MUS1) 14J. The audio inputs 12 may also comprise an audio input 12K for receiving audio communications from a second entertainment radio, MP3 player, or other similar music source (MUS2) 14K. The audio inputs 12A-12K and their associated audio sources 14A-14K illustrated and described herein are only exemplary audio inputs 12 and audio sources 14 and may be replaced with or supplemented with other audio inputs without departing from the scope of the appended claims. In some configurations, the audio inputs 12 may alternatively or additionally comprise one or more alert inputs. In some configurations, the audio inputs 12 may alternatively or additionally comprise one or more passenger inputs (i.e., transceiver and/or microphone).

In some embodiments, microphone 14B may be associated with a headset, handset, or some combination thereof, used by the pilot. In some embodiments, microphone 14D may be associated with a headset, handset, or some combination thereof, used by a co-pilot. The headset may comprise a microphone 14B or 14D and one or more audio equipment 18A or B. Speech from the pilot (or co-pilot) may be conveyed to the audio panel 10 through microphone 14B (microphone 14D for co-pilot).

The audio outputs 16 may comprise a pilot (PILOT) audio output 16A for coupling with and outputting audio communications to audio equipment 18A such as headphones, speakers, or other sound-reproducing equipment worn by or used by a pilot; and a co-pilot (COPLT) audio output 16B for coupling with and outputting audio communications to audio equipment 18B such as headphones, speakers, or other sound-reproducing equipment worn by or used by a co-pilot. The audio outputs 16 may also comprise a passenger (PASS) audio output 16C for coupling with and outputting audio communications to headphones, speakers, or other sound-reproducing equipment 18C worn by or used by one or more passengers; and one or more speaker (SPKR) audio outputs 16D for coupling with and outputting audio communications to cabin speakers, intercom speakers, or other sound-reproducing equipment 18D mounted in a cabin area of the aircraft. The audio outputs 16A-16D and their associated audio equipment 18A-18D illustrated and described herein are only exemplary audio outputs 16 and audio equipment 18 and may be replaced with or supplemented with other audio outputs 16 and audio equipment 18 without departing from the scope of the appended claims.

The selecting circuitry 20 is coupled between the audio inputs 12A-12K and the audio outputs 16A-16D and is operable for selecting and/or routing audio communications from one or more of the audio inputs 12 to one or more of the audio outputs 16 as described in more detail below. The operation of the selecting circuitry 20 may be implemented using hardware, software, firmware, or a combination thereof. In one embodiment, the selecting circuitry 20 may include one or more processors or other electronic devices or components capable of executing logical and mathematical operations. The processors may comprise microprocessors, microcontrollers, programmable logic controllers (PLCs), field-programmable gate arrays (FPGAs), application specific integrated circuits (ASICs), or any other component or components that are operable to perform, or assist in the performance of, the required operations. The processors may be coupled with other components of the audio panel 10 through wired or wireless connections.

The selecting circuitry 20 may also include memory elements for storing instructions or data. The memory elements may be a single component or may be a combination of components that provide the requisite functionality. The memory elements may include various types of volatile or non-volatile memory such as flash memory, optical discs, magnetic storage devices, SRAM, DRAM, or other memory devices capable of storing data and instructions. The memory elements may communicate directly with the processor, or they may communicate with the processor over a data bus or other mechanism that facilitates direct or indirect communication between the devices. The memory elements may optionally be structured with a file system to provide organized access to data existing thereon.

Some functions of the audio panel 10 may be implemented with one or more computer programs stored in or on computer-readable medium residing on or accessible by the selecting circuitry 20. Any such computer programs comprise ordered listings of executable instructions for implementing logical functions in the selecting circuitry 20. The computer programs can be embodied in any computer-readable medium for use by or in connection with an instruction execution system, apparatus, or device, such as a computer-based system, processor-containing system, or other system that can fetch the instructions from the instruction execution system, apparatus, or device, and execute the instructions. In the context of this application, a "computer-readable medium" can be any means that can contain, store, communicate, propagate or transport the program for use by or in connection with the instruction execution system, apparatus, or device. The computer-readable medium can be, for example, but not limited to, an electronic, magnetic, optical, electro-magnetic, infrared, or semi-conductor system, apparatus, device, or propagation medium. More specific, although not inclusive, examples of the computer-readable medium would include the following: an electrical connection having one or more wires, a portable computer diskette, a random access memory (RAM), a read-only memory (ROM), an erasable, programmable, read-only memory (EPROM or Flash memory), an optical fiber, and a portable compact disk read-only memory (CDROM).

The audio input controls 22 are coupled with the selecting circuitry 20 and are provided for selecting the audio inputs 12A-12K and their associated audio sources 14A-14K. Referring to FIGS. 1 and 2, an embodiment of the audio input controls 22 may comprise an audio input selector push button switch 22A or other audio input switch for activating the COM1 radio transceiver 14A; an audio input selector push button switch 22B or other audio input switch for activating the microphone 14B for the COM1 radio transceiver; an audio input selector push button switch 22C or other audio input switch for activating the COM2 radio transceiver 14C; and an audio input selector push button switch 22D or other audio input selector push button switch for activating the microphone 14D for the COM2 radio transceiver. The audio input controls 22 may also comprise an audio input selector push button switch 22E or other audio input switch for activating the AUX1 radio transceiver 14E; an audio input selector push button switch 22F or other audio input switch for activating the AUX2 radio transceiver 14F; an audio input selector push button switch 22G or other audio input switch for activating the NAV1 navigation receiver 14G; an audio input selector push button switch 22H or other audio input switch for activating the NAV2 navigation receiver 14H; an audio input selector push button switch 22I or other audio input switch for activating the telephone 14I; audio input selector push button switch 22J or other audio input switch for activating the MUS1 music source 14J; and an audio input selector push button switch 22K or other audio input switch for activating the MUS2 music source 14K. In some embodiments, the audio input selector push button switch 22A-22K may be LED-illuminated. The audio input controls 22 illustrated and described herein are only exemplary controls and may be replaced with or supplemented with other controls without departing from the scope of the claims.

In some embodiments, the audio input controls 22 may additionally comprise one or more replay inputs. For instance, the audio panel 10 may include a PLAY button that allows users to reply the last recorded primary radio communication.

In some embodiments, the audio input controls 22 may alternatively or additionally comprise one or more consolidated inputs. For instance, the audio input controls 22 may integrate a single input providing the functionality of selecting and deselecting all auxiliary inputs, such as audio input selector push button switch 22E or other audio input switch for activating the AUX1 radio transceiver 14E and audio input selector push button switch 22F or other audio input switch for activating the AUX2 radio transceiver 14F.

The audio output controls 24 are also coupled with the selecting circuitry 20 and are provided for controlling operation of the audio output ports 16A-16D and their associated audio equipments 18A-18D. An embodiment of the audio output controls 24 may comprise an audio output push button switch 24A or other audio output switch for activating the Pilot audio equipment 18A; an audio output push button switch 24B or other audio output switch for activating the Co-Pilot audio equipment 18B; an audio output push button switch 24C or other audio output switch for activating the Passenger audio equipment 18C; and an audio output push button switch 24D or other audio output switch for activating the Speaker audio equipment 18D. In some embodiments, the push button switches 24A-24D may be LED-illuminated. The audio output controls 24 illustrated and described herein are only exemplary controls and may be replaced with or supplemented with other controls without departing from the scope of the claims.

The audio characteristic controls 26 are also coupled with the selecting circuitry 20 and are provided for facilitating adjustment of audio characteristics, such as volume or squelch, of the audio inputs 12 and/or audio outputs 16. An embodiment of the audio characteristic controls 26 include an audio input selector 27 for permitting selection of one of the audio inputs 12 or audio outputs 16 and an audio controller 29 for permitting adjustment of an audio characteristic of the selected audio input or audio output. In one embodiment, the audio input selector 27 comprises a rotatable audio input selector knob 27A with discrete rotary positions, each corresponding to one of the audio inputs 12 or audio outputs 16, for selecting between the various audio inputs 12 and audio outputs 16. In some embodiments, each position of the audio input selector knob 27A may correspond to more than one audio input 12 or audio outputs 16. The audio controller 29 may comprise a rotatable and depressible audio controller knob 29A that may be rotated to variably adjust the audio characteristic of a selected audio input or audio output and depressed to initiate a mode of the selecting circuitry 20 as described below. In other embodiments, the audio input selector 27 and the audio controller 29 may additionally or alternatively comprise other inputs such as switches, buttons, dials, combinations thereof, and the like. For instance, the audio characteristic controls 26 may be buttons positioned on aircraft control mechanisms (i.e., yoke, post, cyclic, sidestick, center stick, joystick, or throttle). Such a configuration may be useful for helicopter pilots.

In an embodiment of the technology illustrated in FIGS. 1 and 2, the rotatable audio input selector knob 27A is concentrically disposed around the rotatable audio controller knob 29A so as to minimize the amount of panel space occupied by the knobs and to provide more intuitive and ergonomic operation of the knobs. For instance, the pilot or co-pilot may select an audio input 12 by rotating the outer audio input selector knob 27A and then quickly adjust an audio characteristic, such as volume, by rotating the audio controller knob 29A without having to reach for knobs installed at different locations on the audio panel 10. This embodiment provides intuitive and ergonomic functionality that simplifies the process of adjusting an audio characteristic while also optimizing the limited panel space in the aircraft. The audio input selector knob 27A and the audio controller knob 29A illustrated and described herein are only exemplary controls corresponding to the audio characteristic controls 26 that may be provided with the audio panel 10 and may be replaced with or supplemented with other controls without departing from the scope of the claims.

The audio characteristic indicator 28 is also coupled with the selecting circuitry 20 and is provided for visually indicating a magnitude or level of an audio characteristic for a selected audio input 12 or audio output 16. The audio characteristic indicator 28 may indicate a variety of audio characteristic levels. For instance, the audio characteristic indicator 28 may be used to indicate the volume level of a selected audio input 12. The audio characteristic indicator 28 may also be used to indicate the squelch level of one of the microphones. The audio characteristic indicator 28 may also be configured to present a real-time amplitude indication (e.g., the RMS value) of the audio input or audio output. The audio characteristic indicator 28 may be configured to present any equalizer-type information. In one embodiment, the audio characteristic indicator 28 is an electronic display indicator comprising a plurality of aligned LEDs or other lights that together form an indicator bar that indicates the relative level or magnitude of an audio characteristic. The LED confirmation may be a vertical alignment of LEDs, horizontal alignment of LEDs, or curved alignment of LEDs. A relatively low audio characteristic level may be represented by a single bar of the electronic display indicator being lit, and a relatively high audio characteristic level may be represented by all of the bars of the electronic display indicator being lit. In another embodiment, the audio characteristic indicator 28 may be in the form of a numeric indicator presenting the current audio characteristic level. In some embodiments, the audio characteristic indicator 28 may be divided into two or more sections, such as columns or rows, to indicate multiple audio characteristics for an audio input 12 or audio output 16 or the same audio characteristic for multiple audio inputs 12 or audio output 16. For instance, the audio characteristic indicator 28 may be divided into two columns wherein one column indicates the volume level for a selected audio input 12 and the squelch level of one of the microphones simultaneously.

The audio input indicators 30 are also coupled with the selecting circuitry 20 and provide user feedback about the status of the audio inputs 12. In some embodiments, the audio input indicators 30 may be lights and/or indicators that are part of and/or embedded within the audio input controls 22. For instance, in one configuration, the audio input indicators 30 are embedded within the audio input selector push button switches 22A-22K. In one embodiment, the audio input indicators 30 may comprise LEDs or other audio input indicator lights 30A-30K positioned adjacent to each of the audio input switches 22A-22K. Each audio input indicator light 30A-30K is illuminated by the selecting circuitry 20 when its corresponding audio input is active, selected for adjustment, or selected for a mode of the selecting circuitry 20 as described in more detail below. In one embodiment, the indicator lights 30A-30K are multi-color LEDs that are lit in one color (white) to indicate one mode of operation and another color (blue) to indicate another mode of operation as described in more detail below.

The audio output indicators 32 are also coupled with the selecting circuitry 20 and provide user feedback about the status of the audio outputs 16 and their corresponding audio equipment 18. In some embodiments, the audio output indicators 32 may be lights and/or indicators that are part of and/or embedded within the audio output controls 24. For instance, the audio output indicators 32 may be embedded within the audio output push button switches 24A-24D. In one embodiment, the audio output indicators 32 may comprise LEDs or other audio output indicator lights 32A-32D positioned adjacent each of the audio output push button switches 24A-24D. Each audio output indicator light 32A-32D is illuminated by the selecting circuitry 20 when its corresponding audio output is active, selected for adjustment, or selected for a mode of the selecting circuitry 20 as described in more detail below. In one embodiment, the indicator lights 32A-32D are multi-color LEDs that are lit in one color (white) to indicate one mode of operation and another color (blue) to indicate another mode of operation as described in more detail below.

The audio panel 10 may also comprise a marker beacon receiver/indicator (MKR/MUTE) push button switch 34 with high/low sensitivity selections and an associated marker beacon indicator light 36. In some embodiments, the marker beacon receiver/indicator (MKR/MUTE) push button switch 34 may be LED illuminated. In some embodiments, the audio panel 10 may comprise one or more marker beacon indicator lights 36. The indications may comprise outer (O), middle (M), and inner (I) marker beacon indicator lights 36, wherein one or more of the marker beacon indicator lights 36 are activated if a marker beacon receiver receives a properly formatted activation signal. In some embodiments, the audio panel 10 may incorporate the marker beacon receiver but not provide one or more marker beacon position indicator lights 36.

The audio panel 10 may also contain manual squelch adjustment for each microphone 14B and 14D in addition to an automatic squelch threshold. In some embodiments, the audio panel may provide for the adjustment by including a manual squelch (MAN SQ) push button switch 38 for providing manual squelch adjustment. In some embodiments, the manual squelch (MAN SQ) push button switch 38 may be LED illuminated. The audio panel 10 may also contain a manual squelch LED or other indicator light 40 to provide user feedback about the status of the manual squelch. In one embodiment, the manual squelch LED or other indicator light 40 may be positioned adjacent to the manual squelch (MAN SQ) push button switch 38.

The audio panel 10 and its components may be powered by a DC or AC power source. In some embodiments, the audio panel 10 may be powered by a 14 or 28 volt source without voltage converters or dropping resistors. The audio panel may also include a photo cell sensor for dimming or brightening the various indicators depending on the level of brightness in the environment around the sensor. In one embodiment, the photo cell sensor is positioned facing the aircraft cockpit on the audio panel 10.

The audio panel 10 and its components described above implement an audio characteristic adjustment mode and an audio communication routing mode. In the audio characteristic adjustment mode, a user may adjust the volume level, squelch level, and any other audio characteristic of the selected audio inputs 12 and audio outputs 16 using only the audio characteristic controls 26. In the routing mode, a user may select to distribute audio communications from selected audio inputs 12 to selected audio outputs 16 using the audio input controls 22, audio output controls 24, and audio characteristic controls 26, or some combination thereof.

In an embodiment, to initiate the audio characteristic adjustment mode on the audio panel 10, a user first rotates the audio input selector knob 27A to select one of the audio inputs 12 or audio outputs 16 for adjustment. Each position of the audio input selector knob 27A corresponds to one of the audio inputs 12 or audio outputs 16. As the audio input selector knob 27A is rotated, the audio input indicator 30 or audio output indicator 32 positioned above a selected audio input switch or audio output switch begins to flash in a first color, such as white, to indicate that it has been selected for adjustment. For example, if the user wishes to adjust the volume level of the AUX1 transceiver 14E, the user rotates the audio input selector knob 27A until the indicator 30E above the AUX1 audio input selector push button switch 22E begins to flash white.

In some embodiments, the user may initiate the audio characteristic adjustment mode by pressing one of the audio input selector push button switches 22A-22K or audio output push button switches 24A-24D to activate its corresponding audio source or audio output. For example, if the AUX1 audio input 12E is not currently active and the audio input indicator light 30E above the AUX1 audio input selector push button switch 22E is therefore not lit, the user may press the AUX1 audio input selector push button switch 22E to activate the AUX1 audio source 14E. Depressing and releasing the AUX1 audio input selector push button switch 22E initiates the volume adjustment mode and causes the audio input indicator light 30E above the AUX1 audio input selector push button switch 22E to begin to flash white or another first color. In some embodiments, the audio input indicator light 30E above the AUX1 audio input selector push button switch 22E may remain lit (i.e., active) in a white or another first color.

Once an audio input 12 or audio output 16 has been selected for adjustment via either of the methods described above, the user may rotate the rotatable audio controller knob 29A to adjust an audio characteristic of the selected audio input 12 or audio output 16. For example, the user may rotate the audio controller knob 29A in a clockwise direction to increase the volume or squelch level of the selected audio input 12 or audio output 16 or rotate the audio controller knob 29A in a counter-clockwise direction to decrease the volume or squelch level of the selected audio input 12 or audio output 16.

The period of time within which the audio characteristic of a selected audio input 12 or audio output 16 may be adjusted may be terminated in several ways. For example, the selecting circuitry 20 may include a time-out function that exits the volume adjustment mode after a pre-determined amount of time elapses after the user rotates the audio input selector knob 27A. In an embodiment, the audio panel 10 may indicate this period by continuing to flash the audio input indicator light 30A-30K or audio output indicator light 32A-32D above its corresponding audio input selector push button switch 22A-22K or audio output push button switches 24A-24D. Alternatively, the audio panel may be programmed to immediately exit the adjustment mode when a user depresses the audio controller knob 29A or any other designated button or knob on the audio panel. The audio panel may also be programmed to exit the adjustment mode when a user presses any of the audio input selector push button switches 22A-22K, such as the COM1 or COM2 audio input selector push button switches, or the audio output push button switches 24A-24D. The adjustment mode may be exited when an audio input 12 or audio output 16 changes its state to become active or inactive. In some embodiments, the audio panel 10 may exit the adjustment mode after a predetermined length of time has passed from the time the adjustment mode was entered.

In some embodiments, the audio panel 10 may link the operation and/or status of one or more audio inputs 12 and audio outputs 16 in response to discrete signal(s) received from another audio input 12 or audio output 16. For instance, the selecting circuitry 20 may cause a change in the status of pilot audio output 16A and co-pilot audio output 16B in response to a discrete signal received from audio input for COM1 12A. It is to be understood that the selecting circuitry 20 may process discrete signals and that any of the audio inputs 12 and audio outputs 16 may be configured to receive and/or transmit discrete signals.

While an audio characteristic of an audio input 12 or audio output 16 is being adjusted, the relative level or magnitude of the audio characteristic may be indicated by the audio characteristic indicator 28. For example, if the TEL audio input 12I is adjusted to 50% of its maximum allowed volume and the audio characteristic indicator 28 consists of eight LEDs, the bottom four of the LEDs of the audio characteristic indicator 28 may be lit and the top four LEDs may be turned off. In some embodiments, the selecting circuitry 20 may also provide audible feedback of the audio characteristic level through audible beeps or tones. For example, as the volume of an audio input 12 or audio output 16 is increased, the tones may get louder, and as the volume is decreased, the tones may get softer (i.e., quieter). In some embodiments, the selecting circuitry 20 may also provide vibrating feedback of the audio characteristic level through varying vibrations. For example, as the volume of an audio input 12 or audio output 16 is increased, the vibration may increase in magnitude and/or duration, and as the volume is decreased, the vibration may decrease in magnitude and/or duration.

Once the user has adjusted the volume or squelch level of the selected audio input 12 or audio output 16, the user may again rotate the audio input selector knob 27A to select another audio input 12 or audio output 16 for adjustment. In an embodiment, this causes the audio input indicator 30A-30K positioned above the newly selected audio input push button switch 22A-22K or the audio output indicator 32A-32D positioned above the newly selected audio output, to flash white and the audio characteristic indicator 28 to indicate the relative volume, squelch, or other characteristic level of the newly selected audio input 12 or audio output 16.

The selecting circuitry 20 may be programmed or otherwise configured to permit adjustment of all of the audio inputs 12 and audio outputs 16 with the controls described above or to permit selective adjustment of one or more of the audio inputs 12 and audio outputs 16. The selecting circuitry 20 may also be programmed to set one of the audio inputs 12 or audio outputs 16 to be the “default” input when a user rotates the audio controller knob 29A without first selecting one of the audio inputs 12 or outputs 16 using the audio input selector knob 27A or pressing one of the audio input selector push button switches 22A-22K or audio output push button switches 24A-24D. For example, the selecting circuitry 20 may be configured to always adjust the volume of the pilot audio output 16A when the audio controller knob 29A is rotated without use of the audio input selector knob 27A, selection of an audio input selector push button switch 22A-22K, or audio output push button switch 24A-24D. This allows the pilot to quickly and intuitively increase or decrease the volume of his or her headset without selecting an audio input 12 or audio output 16.

The audio inputs 12 and/or audio outputs 16 may be programmed with minimum and/or maximum volume levels to prevent unintended muting of audio sources 14 and to prevent excessive headset and speaker volume levels outputted to the output audio equipment 18.

The settings for minimum and maximum volume levels, squelch levels, and other configurable settings may be set and/or changed in the audio panel using the front face of the audio panel 10. In some embodiments, the settings may be extracted and submitted using an external configuration device, such as a personal computer or other configuration tool, that is connected to the audio panel 10 via an interface located on the front face of the audio panel or through rear connections of the audio panel. In some embodiments, the interface may be an audio jack 42. The audio jack 42 may include a round female connector for accepting and connecting with the pin-shaped male plug from a standard audio device. The configuration device may also be used to make other configuration changes, check wiring, and test the audio inputs 12 and audio outputs 16 during installation and/or testing of the audio panel. Additionally or alternatively, such minimum and maximum volume levels and other configuration settings may be set and/or changed via a configuration setting mode that is triggered by pressing designated controls on the audio panel 10. For example, the selecting circuitry 20 may be programmed to enter a configuration mode whenever it detects that the MKR/MUTE button is pressed and held for five seconds or more. While in this configuration mode, other buttons can be designated to enter and/or adjust certain configuration settings such as minimum and maximum volume levels.

The audio routing mode may be used to route or select audio communications from selected audio inputs 12 to selected audio outputs 16. As with the audio characteristic adjustment mode, the selecting circuitry 20 may be programmed or otherwise configured to permit routing of all the audio inputs 12 and audio outputs 16 or select audio inputs 12 and audio outputs 16.

A user may initiate the audio routing mode by depressing the audio controller knob 29A or any other knob, button, or discrete input designated to function as the audio controller 29. The user may then select one of the audio inputs 12 for routing by rotating the audio input selector knob 27A. While in the audio routing mode, the audio input indicators 30 above the associated audio input controls 22 will flash in a second color that is different from the first color used to indicate the adjustment mode described above. For example, if the user wishes to route the telephone (TEL) audio input 12I from telephone audio source 14I, the user rotates the audio input selector knob 27A until the indicator 30I above the TEL audio input selector push button switch 22I flashes a second color rather than the first color (e.g., by flashing blue instead of white). In some configurations, the audio routing mode is automatically entered if the user selects an audio input that is currently not routed to any one of the audio outputs 16. In embodiments where a knob, button, or discrete input other than audio controller knob 29A is used to initiate the audio routing mode, the audio controller knob 29A may be used to select one of the audio inputs 12 for routing.

Once an audio input has been selected for routing, the user may then select one or more of the audio outputs 16 for receiving audio communications from the selected audio input 12. This may be done by pressing one or more of the audio output push button switches 24A-24D. In some embodiments, the audio output indicators 32 above the selected audio output controls 24 will indicate selection by remaining lit or flashing. For example, if the user wishes to route audio communications from the TEL audio input 12I to the output equipment for the pilot 18A and the co-pilot 18B, the user may press the PILOT audio output push button switch 24A and COPLT audio output push button switch 24B. If successfully selected as audio outputs, this causes the audio output indicators 32A and 32B to indicate selection by remaining lit or flashing.

When the desired audio routing is completed, the user can exit the routing mode by simply waiting for a time-out to expire, by depressing the audio controller knob 29A While in the audio routing mode, the user may also rotate the audio controller knob 29A to adjust the volume or squelch level of a selected audio input 12 or audio output 16.

The selecting circuitry 20 may also be programmed to temporarily block, mute, or reduce the volume for certain audio inputs 12 based on preset criteria. This may be desired to focus the listener's attention to audio signals of high priority. For example, when the audio inputs for COM1 14A or COM2 14C and a TEL 14I are selected to be routed to an audio output 16, the TEL audio input 14I will be muted whenever a transmission is received on the selected COM channel, as well as when a transmission is made on the selected COM channel. This muting does not occur for anyone who is interfacing with the TEL audio input 14I but is not currently receiving the selected COM channel on which the transmission is received and/or made.

The selecting circuitry 20 may also be programmed or otherwise configured to prevent, or alert a user of, incomplete routing of the audio inputs 12. For example, if the audio inputs for the Telephone 12I, Music 1 12J, or Music 2 12K are not routed to any of the audio outputs 16, the selecting circuitry 20 may indicate the audio input's de-selection and/or prevent these audio inputs 12 from being selected. For example, if the Telephone audio input 12I is not routed to any of the audio outputs for the pilot 16A, co-pilot 16B, or passengers 16C, and a user attempts to turn on the telephone audio input 12I by pressing the telephone audio input switch 22I, the selecting circuitry 20 will illuminate the audio input indicator 30I above the TEL audio input selector push button switch 22I in a blue color to prompt the user to select one of the audio output push button switches 24A-24D to which the telephone audio should be routed to. However, if the user does not route the telephone input 12I to an audio output within a predetermined time period, the selecting circuitry 20 terminates the routing mode and turns the audio input indicator 30I above the TEL audio input selector push button switch 22I off again. This feature ensures that the pilot or co-pilot does not mistakenly believe that the telephone audio input 12I is active when none of the audio outputs 16 has been selected to receive communications from it. The selecting circuitry 20 may also be programmed or otherwise configured to prevent the audio inputs for COM1 12A and COM2 12C from being routed to anyone but the pilot and co-pilot and may even be programmed to always route the audio input COM1 12A and audio input COM2 12C to one or both of the pilot or co-pilot regardless of operation of the above-described controls.

The above-described embodiments of the audio panel 10 provide numerous advantages. For example, by providing an audio panel with a single audio input selector 27 and single audio controller 29 for controlling the volume, squelch level, and/or other audio characteristic of multiple audio inputs 12 and audio outputs 16, the audio panel 10 can be made smaller to accommodate limited cockpit space and/or designed to provide greater functionality without increasing its size. The size of the audio panel 10 may be further limited by embodiments which provide the audio input selector knob 27A concentrically disposed around the audio controller knob 29A. Similarly, by providing an audio panel 10 with a single electronic display audio characteristic indicator 28 for indicating an audio characteristic level of any selected audio input 12 or audio output 16, the audio panel 10 can provide volume or squelch level feedback to an operator while maintaining a small overall footprint on the aircraft instrument panel. Moreover, by providing an audio panel 10 with the audio routing functionality described above, audio communications from any selected audio input 12 can be quickly and easily routed to any selected audio outputs 16 in a dynamic method without requiring memorization of or reference materials for preset intercom isolation modes.

Although the technology has been described with reference to the embodiments illustrated in the attached drawing figures, equivalents may be employed and substitutions made herein without departing from the scope of the technology as recited in the claims.

What is claimed is:

1. An aircraft audio panel comprising:

a plurality of audio inputs each configured for receiving audio communications from an audio source;

a plurality of audio outputs each configured for outputting the audio communications to audio equipment in the aircraft;

a rotatable audio controller knob to select an audio input for routing in an audio communication routing mode;

a plurality of audio input indicators associated with the audio inputs to indicate selection of an audio input;

a plurality of audio output controls associated with the audio outputs; and selecting circuitry for selecting audio communications received by the audio inputs and distributing the received audio communications to one or more selected audio outputs in the audio communication routing mode;

wherein one of the audio inputs is selected for routing by rotating the audio controller knob to illuminate the audio input indicator associated with an audio input to be selected for routing by the selecting circuitry;

wherein one or more audio outputs output the audio communications to the audio equipment when an audio output control associated with the one or more audio outputs is selected; and wherein one or more one or more audio input indicators are illuminated in a second color while the selecting circuitry operates in the audio communication routing mode.

2. The aircraft audio panel as set forth in claim 1, further comprising a user interface coupled with the selecting circuitry that may be operated by the user to initiate the audio communication routing mode.

3. The aircraft audio panel as set forth in claim 1, wherein the audio controller knob permits adjustment of an audio characteristic of the audio inputs or audio outputs and one or more audio input indicators are illuminated in a first color while the selecting circuitry operates in an audio characteristic adjustment mode.

4. The aircraft audio panel as set forth in claim 3, wherein the audio characteristic is a volume level or a squelch level adjusted by rotating the audio controller knob while the selecting circuitry operates in the audio characteristic adjustment mode.

5. The aircraft audio panel as set forth in claim 1, wherein the audio inputs comprise one or more communication radio inputs, one or more auxiliary radio inputs, one or more telephone inputs, one or more alert inputs, or one or more music inputs; and the audio outputs comprise a pilot audio output, a co-pilot audio output, a passenger audio output, or a cabin speaker output.

6. The aircraft audio panel as set forth in claim 1, wherein the audio equipment comprises headphones or speakers.

7. The aircraft audio panel as set forth in claim 1, further comprising a plurality of audio output indicators associated with audio inputs to indicate selection of an audio output.

8. The aircraft audio panel as set forth in claim 1, wherein the audio communication routing mode of the selecting circuitry is initiated when the rotatable audio controller knob is depressed.

9. The aircraft audio panel as set forth in claim 1, wherein the audio communication routing mode is terminated and the audio input indicator associated with the audio input is not illuminated if an audio output is not selected to receive audio communications from the selected audio input to prevent incomplete routing of the selected audio input.

10. The aircraft audio panel as set forth in claim 1, wherein the selecting circuitry is configured to exit configuration of the audio communication routing mode when an audio output control associated with the audio output is depressed.

11. The aircraft audio panel as set forth in claim 1, wherein the audio output controls are push button switches.

12. An aircraft audio panel comprising:

a plurality of audio inputs each configured for receiving audio communications from an audio source;

a plurality of audio outputs each configured for outputting the audio communications to audio equipment in the aircraft;

selecting circuitry for selecting audio communications received by the audio inputs and distributing the received audio communications to one or more selected audio outputs the audio outputs, the selecting circuitry having an audio communication routing mode in which audio communications from selected ones of the audio inputs may be routed to selected ones of the audio outputs;

a plurality of audio input controls coupled with the selecting circuitry and each associated with one of the audio inputs, each audio input control configured for permitting selection of one of the audio inputs to be routed by the selecting circuitry; and a plurality of audio output controls coupled with the selecting circuitry and each associated with one of the audio outputs, each audio output control configured for permitting selection of its respective audio output to be routed by the selecting circuitry while the selecting circuitry is in the audio communication routing mode;

wherein the one or more selected audio outputs receive audio communication from the selected audio input and output the audio communications to the audio equipment; and wherein the audio input indicators are coupled with the selecting circuitry and are illuminated in a second color to indicate that the selecting circuitry is in the audio communication routing mode.

13. The aircraft audio panel as set forth in claim 12, further comprising a plurality of audio input indicators are associated with the audio inputs and indicate selection of an audio input.

14. The aircraft audio panel as set forth in claim 12, further comprising a rotatable audio controller knob, wherein the audio communications routing mode of the selecting circuitry is initiated when the rotatable audio controller knob is depressed.

15. The aircraft audio panel as set forth in claim 14, wherein the audio controller knob permits adjustment of an audio characteristic of the audio inputs or audio outputs and the audio input indicators are illuminated in a first color while the selecting circuitry operates in an audio characteristic adjustment mode.

16. The aircraft audio panel as set forth in claim 12, wherein the audio communication routing mode is terminated and the audio input indicator associated with the audio input is not illuminated if an audio output is not selected to receive audio communications from the selected audio input to prevent incomplete routing of the selected audio input.

17. An aircraft audio panel comprising:

a plurality of audio inputs each configured for receiving audio communications from an audio source;

a plurality of audio outputs each configured for outputting the audio communications to audio equipment in the aircraft;

a rotatable audio controller knob to select an audio input for routing in an audio communication routing mode;

a plurality of audio input indicators associated with the audio inputs to indicate selection of an audio input;

a plurality of audio output controls associated with the audio outputs; and selecting circuitry for selecting audio communications received by the audio inputs and distributing the received audio communications to one or more selected audio outputs in the audio communication routing mode;

wherein one of the audio inputs is selected for routing by rotating the audio controller knob to illuminate the audio input indicator associated with an audio input to be selected for routing by the selecting circuitry;

wherein one or more audio outputs output the audio communications to the audio equipment when an audio output control associated with the one or more audio outputs is selected; and wherein the selecting circuitry is configured to exit configuration of the audio communication routing mode-after a pre-determined amount of time has elapsed after the user has initiated configuration of the audio communication routing mode.

18. The aircraft audio panel as set forth in claim 17, further comprising a user interface coupled with the selecting circuitry that may be operated by the user to initiate the audio communication routing mode.

19. The aircraft audio panel as set forth in claim 17, wherein the audio controller knob permits adjustment of an audio characteristic of the audio inputs or audio outputs and one or more audio input indicators are illuminated in a first color while the selecting circuitry operates in an audio characteristic adjustment mode, the audio characteristic is a volume level or a squelch level adjusted by rotating the audio controller knob while the selecting circuitry operates in the audio characteristic adjustment mode.

20. The aircraft audio panel as set forth in claim 17, wherein the audio inputs comprise one or more communication radio inputs, one or more auxiliary radio inputs, one or more telephone inputs, one or more alert inputs, or one or more music inputs; and the audio outputs comprise a pilot audio output, a co-pilot audio output, a passenger audio output, or a cabin speaker output.

21. The aircraft audio panel as set forth in claim 17, wherein the audio equipment comprises headphones or speakers.

22. The aircraft audio panel as set forth in claim 17, wherein the audio output controls are push button switches.

23. An aircraft audio panel comprising:

a plurality of audio inputs each configured for receiving audio communications from an audio source;

a plurality of audio outputs each configured for outputting the audio communications to audio equipment in the aircraft;

a rotatable audio controller knob to select an audio input for routing in an audio communication routing mode;

a plurality of audio input indicators associated with the audio inputs to indicate selection of an audio input;

a plurality of audio output controls associated with the audio outputs;

a plurality of audio input controls associated with the audio inputs; and selecting circuitry for selecting audio communications received by the audio inputs and distributing the received audio communications to one or more selected audio outputs in the audio communication routing mode;

wherein the audio communication routing mode is automatically initiated if an audio input control associated with an audio input that is currently not routed by the selecting circuitry to an audio output is depressed;

wherein one of the audio inputs is selected for routing by rotating the audio controller knob to illuminate the audio input indicator associated with an audio input to be selected for routing by the selecting circuitry; and wherein one or more audio outputs output the audio communications to the audio equipment when an audio output control associated with the one or more audio outputs is selected.

24. The aircraft audio panel as set forth in claim 23, further comprising a user interface coupled with the selecting circuitry that may be operated by the user to initiate the audio communication routing mode.

25. The aircraft audio panel as set forth in claim 23, wherein the audio controller knob permits adjustment of an audio characteristic of the audio inputs or audio outputs and one or more audio input indicators are illuminated in a first color while the selecting circuitry operates in an audio characteristic adjustment mode, the audio characteristic is a volume level or a squelch level adjusted by rotating the audio controller knob while the selecting circuitry operates in the audio characteristic adjustment mode.

26. The aircraft audio panel as set forth in claim 23, wherein the audio inputs comprise one or more communication radio inputs, one or more auxiliary radio inputs, one or more telephone inputs, one or more alert inputs, or one or more music inputs; and the audio outputs comprise a pilot audio output, a co-pilot audio output, a passenger audio output, or a cabin speaker output.

27. The aircraft audio panel as set forth in claim 23, wherein the audio equipment comprises headphones or speakers.

28. The aircraft audio panel as set forth in claim 23, wherein the audio output controls are push button switches.

29. An aircraft audio panel comprising:

a plurality of audio inputs each configured for receiving audio communications from an audio source;

a plurality of audio outputs each configured for outputting the audio communications to audio equipment in the aircraft;

a rotatable audio controller knob to select an audio input for routing in an audio communication routing mode;

a plurality of audio input indicators associated with the audio inputs to indicate selection of an audio input;

a plurality of audio output controls associated with the audio outputs; and selecting circuitry for selecting audio communications received by the audio inputs and distributing the received audio communications to one or more selected audio outputs in the audio communication routing mode;

wherein one of the audio inputs is selected for routing by rotating the audio controller knob to illuminate the audio input indicator associated with an audio input to be selected for routing by the selecting circuitry;

wherein one or more audio outputs output the audio communications to the audio equipment when an audio output control associated with the one or more audio outputs is selected; and wherein the selecting circuitry is configured to exit configuration of the audio communication routing mode if an audio output is not selected to receive audio communications from the selected audio input within a predetermined amount of time.

30. The aircraft audio panel as set forth in claim 29, further comprising a plurality of audio input indicators are associated with the audio inputs and indicate selection of an audio input.

31. The aircraft audio panel as set forth in claim 29, further comprising a rotatable audio controller knob, wherein the audio communications routing mode of the selecting circuitry is initiated when the rotatable audio controller knob is depressed.

32. The aircraft audio panel as set forth in claim 31, wherein the audio controller knob permits adjustment of an audio characteristic of the audio inputs or audio outputs and the audio input indicators are illuminated in a first color while the selecting circuitry operates in an audio characteristic adjustment mode.

33. An aircraft audio panel comprising:

a plurality of audio inputs each configured for receiving audio communications from an audio source;

a plurality of audio outputs each configured for outputting the audio communications to audio equipment in the aircraft;

selecting circuitry for selecting audio communications received by the audio inputs and distributing the received audio communications to one or more selected audio outputs the audio outputs, the selecting circuitry having an audio communication routing mode in which audio communications from selected ones of the audio inputs may be routed to selected ones of the audio outputs;

a plurality of audio input controls coupled with the selecting circuitry and each associated with one of the audio inputs, each audio input control configured for permitting selection of one of the audio inputs to be routed by the selecting circuitry; and a plurality of audio output controls coupled with the selecting circuitry and each associated with one of the audio outputs, each audio output control configured for permitting selection of its respective audio output to be routed by the selecting circuitry while the selecting circuitry is in the audio communication routing mode;

wherein the one or more selected audio outputs receive audio communication from the selected audio input and output the audio communications to the audio equipment; and wherein the audio communication routing mode is automatically initiated if an audio input control associated with an audio input that is currently not routed by the selecting circuitry to an audio output is depressed.

34. The aircraft audio panel as set forth in claim 33, further comprising a plurality of audio input indicators are associated with the audio inputs and indicate selection of an audio input.

35. The aircraft audio panel as set forth in claim 33, further comprising a rotatable audio controller knob, wherein the audio communications routing mode of the selecting circuitry is initiated when the rotatable audio controller knob is depressed.

36. The aircraft audio panel as set forth in claim 35, wherein the audio controller knob permits adjustment of an audio characteristic of the audio inputs or audio outputs and the audio input indicators are illuminated in a first color while the selecting circuitry operates in an audio characteristic adjustment mode.

* * * * *